United States Patent
Lu et al.

(10) Patent No.: US 9,257,333 B2
(45) Date of Patent: Feb. 9, 2016

(54) INTERCONNECT STRUCTURES AND METHODS OF FORMING SAME

(71) Applicant: Taiwan Semiconductor Manufacturing Company, Ltd., Hsin-Chu (TW)

(72) Inventors: Wen-Hsiung Lu, Jhonghe (TW); Hsuan-Ting Kuo, Taichung (TW); Tsung-Yuan Yu, Taipei (TW); Hsien-Wei Chen, Hsin-Chu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/838,748

(22) Filed: Mar. 15, 2013

(65) Prior Publication Data
US 2014/0252601 A1    Sep. 11, 2014

Related U.S. Application Data

(60) Provisional application No. 61/776,684, filed on Mar. 11, 2013.

(51) Int. Cl.
*H01L 23/48*  (2006.01)
*H01L 21/768*  (2006.01)
(Continued)

(52) U.S. Cl.
CPC ........ *H01L 21/76885* (2013.01); *H01L 21/566* (2013.01); *H01L 23/293* (2013.01); *H01L 23/3192* (2013.01); *H01L 23/525* (2013.01); *H01L 23/5329* (2013.01); *H01L 24/03* (2013.01); *H01L 24/05* (2013.01);
(Continued)

(58) Field of Classification Search
CPC ............... H01L 21/76894; H01L 21/823475; H01L 23/28; H01L 23/5329
USPC .................... 257/737, 779, 738, 778
See application file for complete search history.

(56) References Cited

U.S. PATENT DOCUMENTS 5,072,520 A    12/1991    Nelson
5,869,904 A    2/1999    Shoji
(Continued)

FOREIGN PATENT DOCUMENTS

DE    102005040213 A1    3/2006
DE    112005001949 T5    5/2007
(Continued)

*Primary Examiner* — Jerome Jackson, Jr.
*Assistant Examiner* — Damian A Hillman
(74) *Attorney, Agent, or Firm* — Slater & Matsil, L.L.P.

(57) ABSTRACT

Embodiments of the present disclosure include interconnect structures and methods of forming interconnect structures. An embodiment is an interconnect structure including a post-passivation interconnect (PPI) over a first substrate and a conductive connector on the PPI. The interconnect structure further includes a molding compound on a top surface of the PPI and surrounding a portion of the conductive connector, a top surface of the molding compound adjoining the conductive connector at an angle from about 10 degrees to about 60 degrees relative to a plane parallel with a major surface of the first substrate, the conductive connector having a first width at the adjoining top surface of the molding compound, and a second substrate over the conductive connector, the second substrate being mounted to the conductive connector.

20 Claims, 5 Drawing Sheets

(51) Int. Cl.
  *H01L 23/525* (2006.01)
  *H01L 23/532* (2006.01)
  *H01L 23/00* (2006.01)
  *H01L 23/29* (2006.01)
  *H01L 23/31* (2006.01)
  *H01L 21/56* (2006.01)

(52) U.S. Cl.
  CPC ............... *H01L 24/11* (2013.01); *H01L 24/13* (2013.01); *H01L 24/16* (2013.01); *H01L 24/81* (2013.01); *H01L 2224/02331* (2013.01); *H01L 2224/036* (2013.01); *H01L 2224/0345* (2013.01); *H01L 2224/0347* (2013.01); *H01L 2224/0362* (2013.01); *H01L 2224/03828* (2013.01); *H01L 2224/05008* (2013.01); *H01L 2224/05548* (2013.01); *H01L 2224/05569* (2013.01); *H01L 2224/05582* (2013.01); *H01L 2224/05639* (2013.01); *H01L 2224/05644* (2013.01); *H01L 2224/05647* (2013.01); *H01L 2224/05684* (2013.01); *H01L 2224/10126* (2013.01); *H01L 2224/1181* (2013.01); *H01L 2224/1191* (2013.01); *H01L 2224/11334* (2013.01); *H01L 2224/11462* (2013.01); *H01L 2224/11849* (2013.01); *H01L 2224/13022* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/814* (2013.01); *H01L 2224/81191* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2924/181* (2013.01)

(56) References Cited

U.S. PATENT DOCUMENTS

| | | | |
|---|---|---|---|
| 6,037,065 A | 3/2000 | Hajmrle et al. | |
| 6,158,644 A | 12/2000 | Brofman et al. | |
| 6,187,615 B1 | 2/2001 | Kim et al. | |
| 6,369,451 B2 * | 4/2002 | Lin | 257/779 |
| 6,425,516 B1 | 7/2002 | Iwatsu et al. | |
| 6,586,322 B1 | 7/2003 | Chiu et al. | |
| 6,643,923 B1 | 11/2003 | Hishinuma et al. | |
| 6,664,637 B2 | 12/2003 | Jimarez et al. | |
| 6,933,613 B2 | 8/2005 | Akashi | |
| 6,940,169 B2 | 9/2005 | Jin et al. | |
| 7,187,068 B2 | 3/2007 | Suh et al. | |
| 7,372,151 B1 | 5/2008 | Fan et al. | |
| 7,749,882 B2 | 7/2010 | Kweon et al. | |
| 7,977,783 B1 | 7/2011 | Park et al. | |
| 8,264,089 B2 | 9/2012 | Alvarado et al. | |
| 8,362,612 B1 | 1/2013 | Paek et al. | |
| 8,735,273 B2 | 5/2014 | Lu et al. | |
| 2001/0050434 A1 | 12/2001 | Kaneda et al. | |
| 2002/0001937 A1 | 1/2002 | Kikuchi et al. | |
| 2003/0068847 A1 | 4/2003 | Watanabe et al. | |
| 2003/0096453 A1 | 5/2003 | Wang et al. | |
| 2004/0012930 A1 * | 1/2004 | Grigg | 361/743 |
| 2004/0027788 A1 | 2/2004 | Chiu et al. | |
| 2004/0072387 A1 | 4/2004 | Hong et al. | |
| 2004/0266162 A1 | 12/2004 | Feng | |
| 2005/0080956 A1 | 4/2005 | Zaudtke et al. | |
| 2006/0038291 A1 | 2/2006 | Chung et al. | |
| 2006/0063378 A1 | 3/2006 | Lin et al. | |
| 2007/0045840 A1 | 3/2007 | Varnau | |
| 2007/0102815 A1 | 5/2007 | Kaufmann et al. | |
| 2007/0108573 A1 | 5/2007 | Chung et al. | |
| 2007/0176290 A1 | 8/2007 | Park et al. | |
| 2007/0184577 A1 | 8/2007 | Chung et al. | |
| 2007/0187825 A1 | 8/2007 | Hashimoto | |
| 2007/0267745 A1 | 11/2007 | Chao et al. | |
| 2008/0001290 A1 | 1/2008 | Chou et al. | |
| 2008/0150134 A1 | 6/2008 | Shinkai et al. | |
| 2008/0308935 A1 | 12/2008 | Kim et al. | |
| 2009/0045513 A1 | 2/2009 | Kim et al. | |
| 2009/0052218 A1 | 2/2009 | Kang | |
| 2009/0130840 A1 | 5/2009 | Wang et al. | |
| 2009/0140442 A1 * | 6/2009 | Lin | 257/778 |
| 2009/0140942 A1 * | 6/2009 | Mikkola et al. | 343/767 |
| 2009/0146317 A1 | 6/2009 | Shih | |
| 2009/0206479 A1 | 8/2009 | Daubenspeck et al. | |
| 2009/0314519 A1 | 12/2009 | Soto et al. | |
| 2010/0065966 A1 | 3/2010 | Pendse et al. | |
| 2010/0078772 A1 | 4/2010 | Robinson | |
| 2010/0096754 A1 | 4/2010 | Lee et al. | |
| 2010/0140760 A1 * | 6/2010 | Tam et al. | 257/660 |
| 2011/0037158 A1 | 2/2011 | Youn et al. | |
| 2011/0101520 A1 | 5/2011 | Liu et al. | |
| 2011/0108983 A1 | 5/2011 | Lu et al. | |
| 2011/0278739 A1 | 11/2011 | Lai et al. | |
| 2012/0006592 A1 | 1/2012 | Ouchi et al. | |
| 2012/0199959 A1 | 8/2012 | Hart et al. | |
| 2012/0261817 A1 | 10/2012 | Do et al. | |
| 2013/0009307 A1 | 1/2013 | Lu et al. | |
| 2013/0105971 A1 | 5/2013 | Daubenspeck et al. | |
| 2013/0147031 A1 | 6/2013 | Chen et al. | |
| 2013/0168850 A1 | 7/2013 | Samoilov et al. | |
| 2013/0181338 A1 | 7/2013 | Lu et al. | |
| 2014/0054764 A1 | 2/2014 | Lu et al. | |
| 2014/0077361 A1 | 3/2014 | Lin et al. | |
| 2014/0159223 A1 | 6/2014 | Chen et al. | |
| 2014/0232017 A1 | 8/2014 | Rampley et al. | |
| 2015/0014851 A1 | 1/2015 | Lu | |

FOREIGN PATENT DOCUMENTS

| | | | |
|---|---|---|---|
| KR | 1020070076846 | | 7/2007 |
| KR | 20090018442 A | | 2/2009 |
| KR | 20090120215 | * | 11/2009 |
| KR | 20090120215 A | | 11/2009 |
| KR | 20100131180 A | | 12/2010 |

* cited by examiner

INTERCONNECT STRUCTURES AND METHODS OF FORMING SAME

This application claims the benefit of U.S. Provisional Application No. 61/776,684, filed on Mar. 11, 2013, entitled "Interconnect Structures and Methods of Forming Same", which application is hereby incorporated herein by reference.

This application relates to the following co-pending and commonly assigned patent applications: Ser. No. 13/349,405, filed Jan. 12, 2012, entitled "Package on Package Interconnect Structure;" Ser. No. 13/751,289, filed Jan. 28, 2013, entitled "System and Method for an Improved Fine Pitch Joint;" Ser. No. 13/868,554, filed Apr. 23, 2013, entitled "Apparatus and Method for Wafer Separation;" Ser. No. 13/913,599, filed Jun. 10, 2013, entitled "Interconnect Joint Protective Layer Apparatus and Method;" Ser. No. 13/914,426, filed Jun. 10, 2013, entitled "Interconnect Structures and Methods of Forming Same;" Ser. No. 13/934,562, filed Jul. 3, 2013, entitled "Packaging Devices, Methods of Manufacture Thereof, and Packaging Methods" and Ser. No. 13/939,966, filed Jul. 11, 2013, entitled "Apparatus and Method for Package Reinforcement."

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Solder ball grid arrays are also a technique sometimes used to join substrate, dies or packages, with an array of solder balls deposited on the bonding pads of a first substrate, and with a second substrate, die or package joined at its own bonding pad sites to the first pad via the solder balls. Solder balls may be formed on a pad as liquid solder, and then solidified for additional processing. The environment with the solder balls is subsequently heated to melt the solder balls and the packages compressed to cause the solder balls to contact the upper and lower pads.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
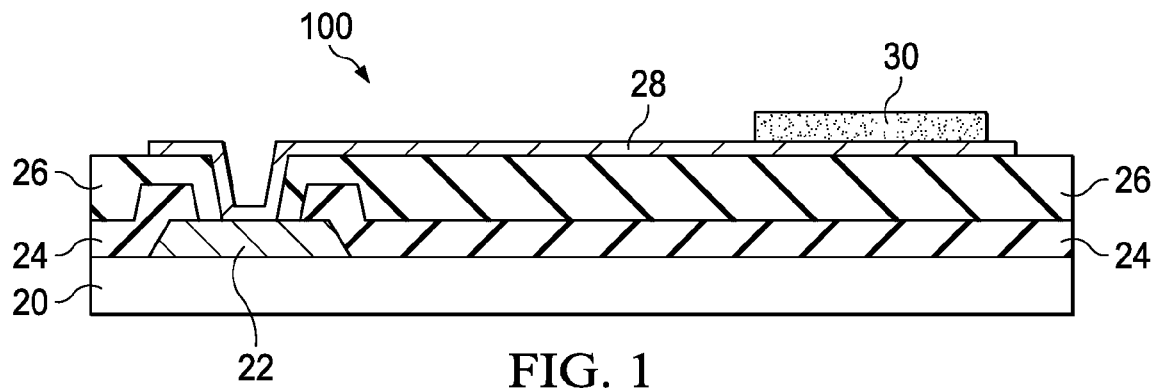
FIGS. 1, 2, 3, 4, 5, 6, and 7 illustrate cross-sectional views of intermediate stages in the manufacturing of an interconnect structure in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely making and using interconnects useful in, for example, WLCSP assemblies. Other embodiments may also be applied, however, to other semiconductor devices, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1 through 7 are cross-sectional views of intermediate stages in the manufacturing of an interconnect structure in accordance with an embodiment, and FIG. 9 is a process flow of the process shown in FIGS. 1 through 7.

FIG. 1 illustrates an interconnect structure 100 in an intermediate stage of manufacture. The interconnector structure 100 may include a substrate 20, a contact pad 22, a first passivation layer 24, a second passivation 26, a post-passivation interconnect (PPI) 28, and an optional flux 30. Substrate 20 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 20 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof.

The substrate 20 may include active and passive devices (not shown in FIG. 1). As one of ordinary skill in the art will recognize, a wide variety of devices such as transistors, capacitors, resistors, combinations of these, and the like may be used to generate the structural and functional requirements of the design for the interconnect structure 100. The devices may be formed using any suitable methods. Only a portion of the substrate 20 is illustrated in the figures, as this is sufficient to fully describe the illustrative embodiments.

The substrate 20 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

The contact pad 22 may be formed over and in electrical contact with the metallization layers in order to help provide external connections to the active and passive devices. The contact pad 22 may comprise aluminum, copper, nickel, the like, or a combination thereof. The contact pad 22 may be formed using a deposition process, such as sputtering, to form a layer of material (not shown). Portions of the layer of material may then be removed through a suitable process, such as photolithographic masking and etching, to form the contact pad 22. However, any other suitable process may be utilized to form contact pad 22. The contact pad 22 may be formed to have a thickness of between about 0.5 µm and about 4 µm.

A first passivation layer 24 may be formed on the substrate 20 and over the contact pad 22. The first passivation layer 24 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, solder resist, polybenzoxazole (PBO), benzocyclobutene (BCB), molding compound, the like, or a combination thereof. The first passivation layer 24 may be formed through a process such as chemical vapor deposition (CVD), although any suitable process may be utilized, and may have a thickness between about 0.5 µm and about 30 µm. In some embodiments, a top surface of contact pad 22 and a portion of a bottom surface of the first passivation layer 24 are substantially level.

After the first passivation layer 24 has been formed, an opening may be formed through the first passivation layer 24 to expose at least a portion of the underlying contact pad 22. This opening through the first passivation layer 24 to expose the portion of the underlying contact pad 22 allows for physical and electrical contact between the contact pad 22 and the PPI 28 (discussed further below). The opening through the first passivation layer 24 may be formed using a suitable photolithographic mask and etching process, although any other suitable process to expose portions of the contact pad 22 may alternatively be used.

The second passivation layer 26 may be formed over the contact pad 22 and the first passivation layer 24. The second passivation layer 26 may be formed from a polymer such as polyimide. Alternatively, the second passivation layer 26 may be formed of a material similar to the material used as the first passivation layer 24, such as silicon oxides, silicon nitrides, low-k dielectrics, extremely low-k dielectrics, BCB, PBO, the like, or a combination thereof. The second passivation layer 26 may be formed to have a thickness between about 2 µm and about 30 µm.

After the second passivation layer 26 has been formed, another opening through the second passivation layer 26 to expose at least a portion of the underlying contact pad 22 may be made. The opening through the second passivation layer 26 to the underlying contact pad 22 allows for physical and electrical contact between the contact pad 22 and the PPI 28 (discussed further below). The opening through the second passivation layer 26 may be formed using a suitable photolithographic mask and etching process, although any suitable process to expose portions of the contact pad 22 may be used.

After the opening through the second passivation layer 26 has been formed, the PPI 28 may be formed to extend through the second passivation layer 26 and to extend along the second passivation layer 26. The PPI 28 may provide electrical connection between the contact pad 22 and the subsequently formed connector 32 (see FIG. 2). In some embodiments, the PPI 28 may include a thin barrier layer (not shown) conformally deposited on the second passivation layer 26 and in the opening, such as by CVD, atomic layer deposition (ALD), the like, or a combination thereof. The barrier layer may comprise a nitride or an oxynitride, such as titanium nitride, titanium oxynitride, tantalum nitride, tantalum oxynitride, tungsten nitride, silicon dioxide, the like, or a combination thereof. The conductive material of the PPI 28 may be deposited over the thin barrier layer and in the opening. The conductive material may be formed by an electro-chemical plating process, CVD, ALD, physical vapor deposition (PVD), the like, or a combination thereof. In an embodiment, the conductive material of the PPI 28 may comprise copper, tungsten, aluminum, silver, gold, the like, or a combination thereof. The conductive material may then be patterned to form the PPI 28. In other embodiments, the PPI 28 may be formed by first forming and patterning a photo resist (not shown), and then forming the PPI 28 in the patterned photo resist. In these embodiments, after the PPI 28 is formed, the photo resist (not shown) may be removed.

After the PPI 28 has been formed, an optional flux 30 may be formed to the PPI 28. The flux 30 may be formed on the PPI 28 to control the spread of the subsequently formed connector 32 (see FIG. 2) on the PPI 28. The flux 30 tends to cause the connector 32 to remain within the region where the flux 30 was applied. In an embodiment, the flux 30 may be formed on the PPI 28 by dipping the PPI 28 in flux so that the flux 30 may be deposited on the PPI 28. In another embodiment, the flux 30 may be depositing as a paste and may be printed on the PPI 28.

Figure 2:
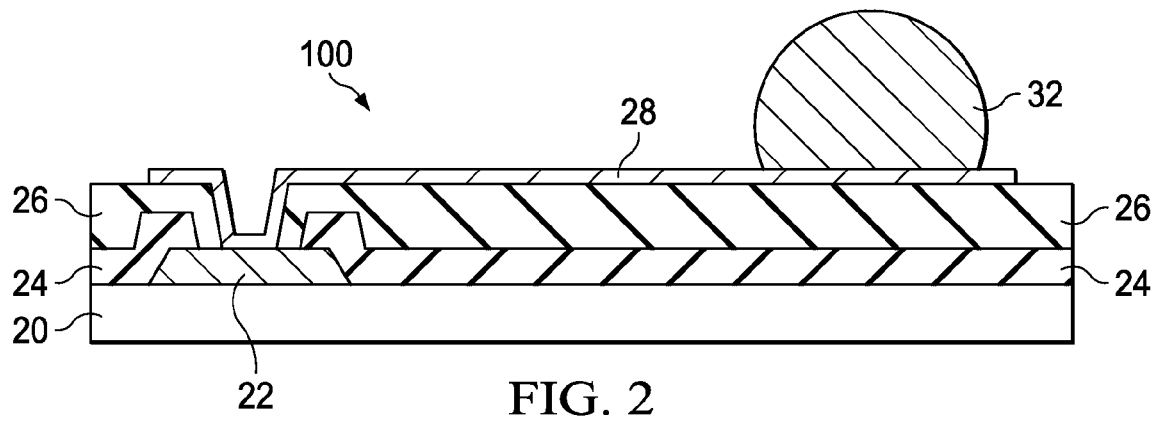

FIG. 2 illustrates the formation of connector 32 (step 402) on the PPI 28. The connector 32 may be a solder ball, a micro bump, a metal pillar, a controlled collapse chip connection (C4) bump, an electroless nickel-electroless palladium-immersion gold technique (ENEPIG) formed bump, or the like. The connector 32 may comprise a conductive material such as copper, aluminum, gold, nickel, silver, palladium, tin, the like, or a combination thereof. In an embodiment in which the connector 32 is a tin solder bump, the connector 32 may be formed by initially forming a layer of tin through such commonly used methods such as evaporation, electroplating, printing, solder transfer, ball placement, or the like. Once a layer of tin has been formed on the structure, a reflow may be performed in order to shape the material into the desired bump shape. In another embodiment, the connector 32 may be a metal pillar (such as a copper pillar) formed by a plating process and may be solder free and comprise substantially vertical sidewalls.

Figure 3:
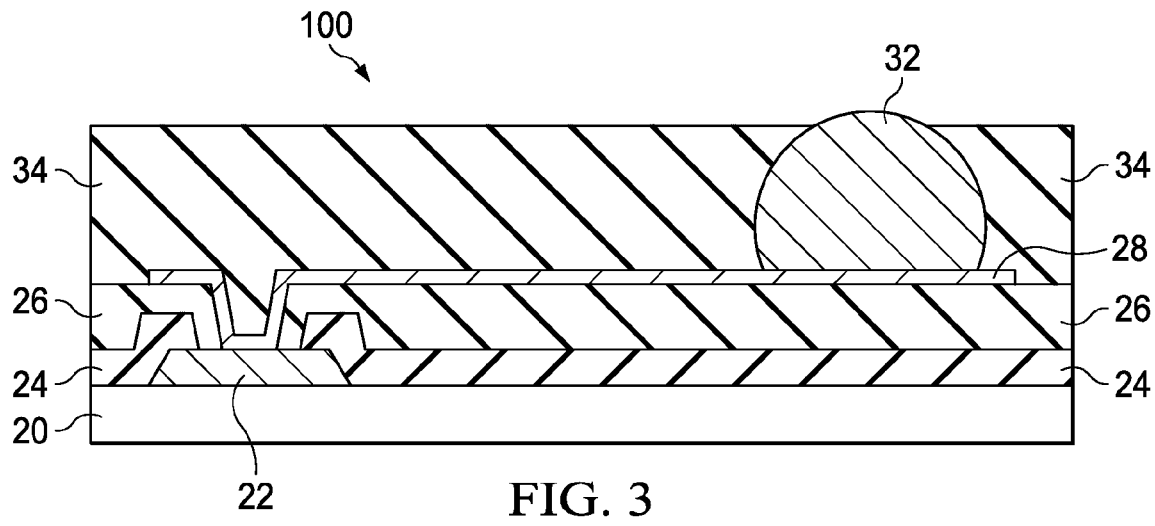

FIG. 3 illustrates the formation of a molding compound 34 (step 404) over the PPI 28 and the second passivation layer 26 and may be formed adjoining the connector 32. The molding compound 34 may provide lateral support to the connector 32 during reflow. In an embodiment, the molding compound 34 may be a nonconductive material, such as an epoxy, a resin, polyimide, polybenzoxazole (PBO), benzocyclobutene (BCB), a silicone, an acrylate, the like, or a combination thereof. The molding compound 34 may be formed to have a top surface over, substantially level with, or below an apex of the connector 32.

Figure 4:
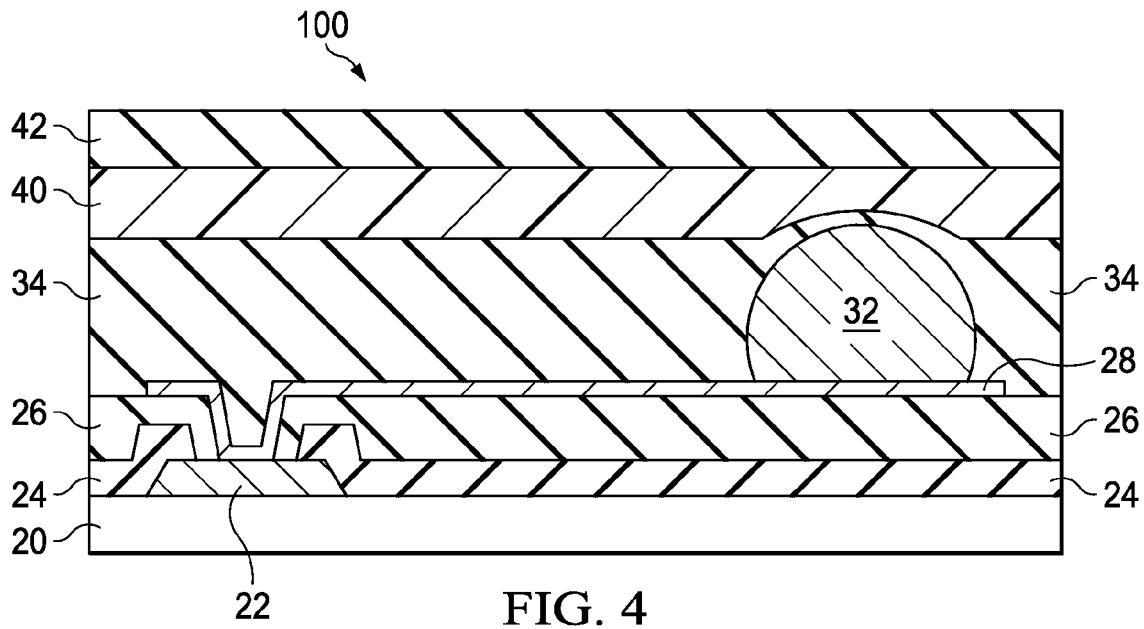

FIG. 4 illustrates applying a mold 42 to the molding compound 34 (step 406). The mold 42 may shape or mold the molding compound 34. In an embodiment, a release compound 40 may be applied to the mold 42 to prevent the molding compound 34 from adhering to the mold 42. The release compound 40 may comprise ethylene tetrafluoroethylene (ETFE), polytetrafluoroethylene (PTFE), the like, or a combination thereof. In an embodiment, the mold 42 may be configured to accept one or more connectors 32 by way of recesses formed in the mold 42. The molding compound 34 may also be shaped by the mold 42 using a layer of release compound 40 thick enough to compress the molding compound 34 while still separating the mold 42 from the connector 32. In an embodiment, the mold 42 may be used to pressure mold the molding compound 34 to force the molding compound into openings and recesses, and may avoid air pockets or the like in the molding compound 34.

Figure 5:
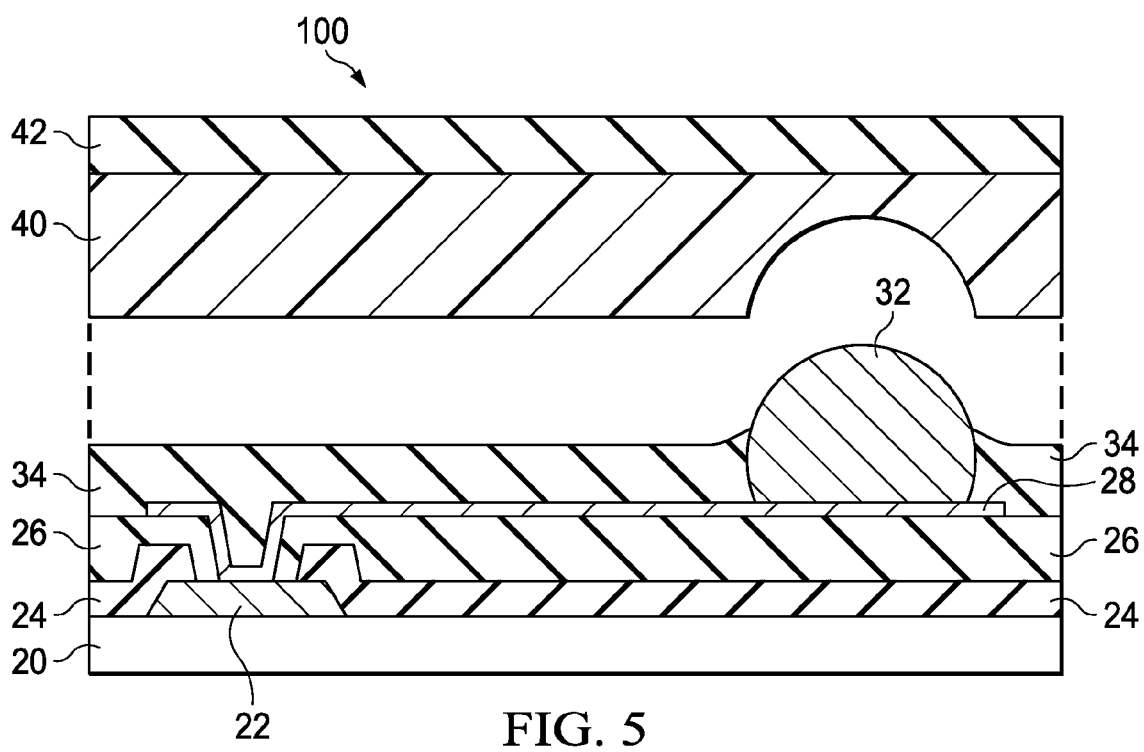

After the application of the mold 42 and the release compound 40, the molding compound may be cured (step 408) and the mold 42 and the release compound 40 may be removed as illustrated in FIG. 5. In some embodiments, the molding compound 34 may be applied while substantially liquid, and then may be cured through a chemical reaction, such as in an epoxy or resin. In some other embodiments the molding compound 34 may be an ultraviolet (UV) cured polymer applied as a gel or malleable solid capable of being disposed on the PPI 28 and second passivation layer 26 and around or conforming to the connector 32 surface.

Figure 6:
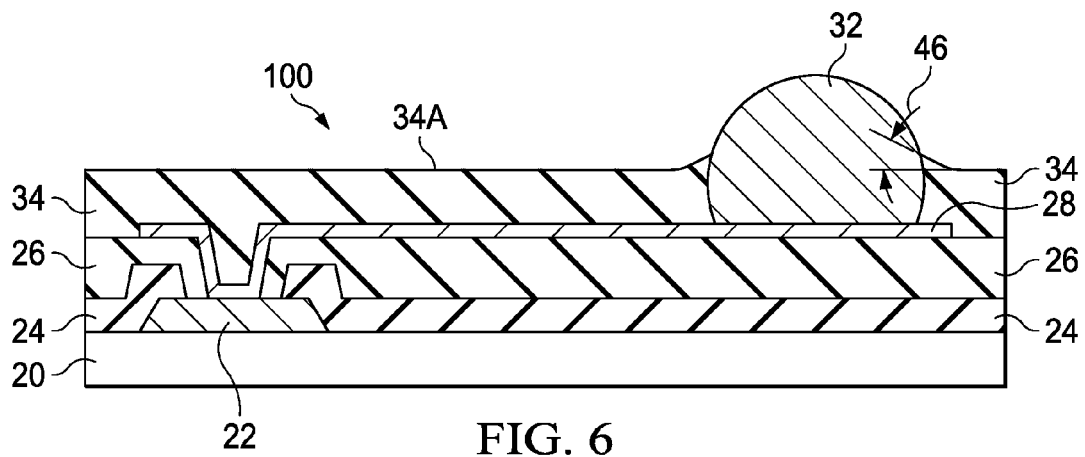

As illustrated in FIG. 6, the molding compound 34 may be molded over a lower portion of the connector 32 so that a portion of the molding compound 34 reaches at least about half of the height of the connector 32. In an embodiment, the molding compound 34 may have a final molded height from about 50 μm to about 350 μm. An upper portion of the connector 32 may be exposed through the molding compound 34. The molding compound 34 is contoured to the body of the solidified connector 32 during application, molding, and curing of the molding compound 34. A top surface 34A of the molding compound 34 near the connector 32 may have a concave shape due to the meniscus effect of the liquid during and after the application and curing processes of the molding compound 34. In some embodiments, the top surface 34A of the molding compound 34 contacts the connector 32 at an angle 46 relative to a plane parallel with a major surface of the substrate 20. In an embodiment, the angle 46 is from about 10 degrees to about 60 degrees.

The molding compound 34 may be formed to support the connector 32 in later processing steps, such as reflowing the connector 32 for attaching a second substrate (see FIG. 7). In such an example, the molding compound 34 may confine the connector 32 and prevent bridging between adjacent connectors during the reflow process.

After the mold 42 and the release compound 40 are removed, a plasma cleaning process may be performed (step 410) on the connector 32. The plasma cleaning process may be used to clean the connector 32 and to remove any residual release compound 40 or molding compound 34.

Figure 7:
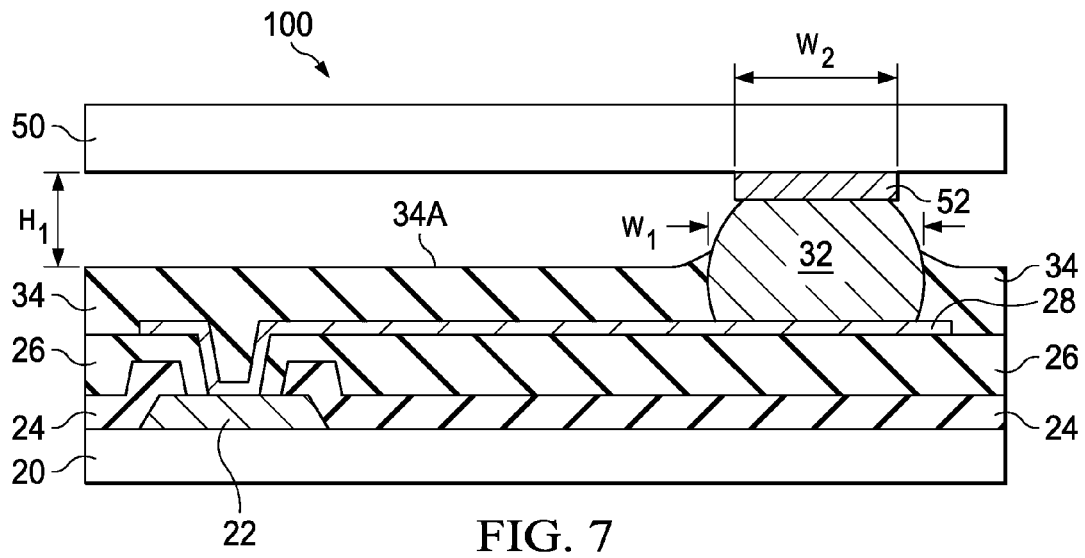

FIG. 7 illustrates bonding a second substrate 50 to the connector 32 (step 412). The second substrate 50 may be similar to the substrate 20 as described above, although the substrate 20 and the second substrate 50 need not be the same. The second substrate 50 may be a carrier, a package substrate, an interposer, or a printed circuit board (PCB) based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto build-up film (ABF) or other laminates may be used for second substrate 50.

The second substrate 50 has a bond pad 52 which will be physically and electrically coupled to the connector 32. In some embodiments, the bond pad 52 may comprise a pre-solder layer, and in other embodiments, the bond pad 52 may comprise a contact pad or an under bump metallization (UBM). The bond pad 52 may comprise copper, nickel, aluminum, gold, silver, tin, the like, or a combination thereof. In an embodiment, the second substrate 50 may be bonded to the connector 32 by a reflow process. During this reflow process, the bond pad 52 on the second substrate 50 is in contact with the connector 32 to physically and electrically couple the second substrate 50 to the PPI 28. The connector 32 bonded to the bond pad 52 of the second substrate 50 may also be referred to as a bonding structure 32. In an embodiment, the second substrate 50 has a standoff height H1 from the top surface 34A of the molding compound 34 from about 20 μm to about 150 μm.

As illustrated in FIG. 7, the connector 32 has a width $W_1$ at the top surface 34A of the molding compound 34 and the bond pad 52 has a width $W_2$. In an embodiment, the ratio of $W_1$ to $W_2$ may be from about 1:1 to about 1.2:1. For example, if the width $W_2$ of the bond pad 52 were 150 μm, then width $W_1$ of the connector 32 at the top surface 34A of the molding compound 34 is in the range from 150 μm to about 180 μm.

The number of connectors 32, the number of bond pads 52, the number of PPIs 28, and the number of contact pads 22 in FIG. 7 are only for illustrative purposes and are not limiting. There could be any suitable number of connectors 32, bond pads 52, PPIs 28, and contact pads 22

Figure 8A:
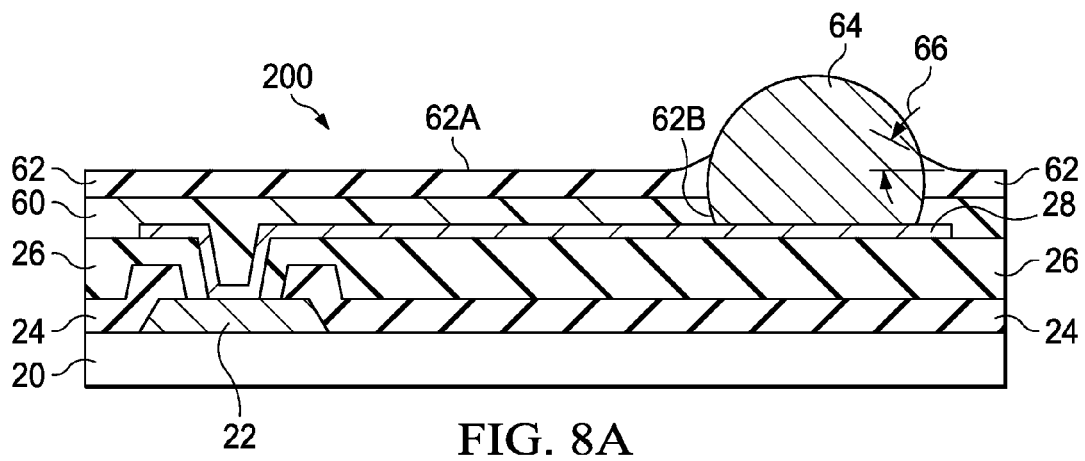
FIGS. 8A and 8B illustrate cross-sectional views of an interconnect structure in accordance with an embodiment.

FIG. 8A illustrates a cross-sectional view of an interconnect structure 200 with a third passivation layer 60 on the second passivation layer 26 and the PPI 28. Details regarding this embodiment that are similar to those for the previously described embodiment will not be repeated herein.

The substrate 20, the contact pad 22, the first passivation layer 24, the second passivation layer 26, the PPI 28 may be similar to those described above and the descriptions will not be repeated herein. The connector 64 may be similar to the connector 32 described above and the description will not be repeated herein, although the connectors 64 and 32 need not be the same. The manufacture of interconnect structure 200 may be similar to interconnect structure 100 in FIGS. 1 and 2.

After the formation of the connector 64, a third passivation layer 60 may be formed on the second passivation layer 26 and the PPI 28 and surrounding a lower portion of the connector 64. The third passivation layer 60 may be formed from a polymer such as polyimide. Alternatively, the third passivation layer 60 may be formed of silicon oxides, silicon nitrides, low-k dielectrics, extremely low-k dielectrics, BCB, PBO, the like, or a combination thereof. The third passivation layer 60 may be formed to have a thickness between about 2 μm and about 30 μm.

After the third passivation layer 60 has been formed, a molding compound 62 may be formed on the third passivation layer 60 and surrounding a middle portion of the connector 64. The molding compound 62 may be similar to the molding compound 34 described above except that it is formed on the third passivation layer 60 rather than the PPI 28 and the second passivation layer 26 and the description of the molding compound will not be repeated. The molding compound may undergo similar processing as molding compound 34 such as pressure molding, curing, and plasma cleaning as described above. In some embodiments, the pressure molding and curing of the molding compound 62 may cause a portion 62B of molding compound 62 to fill between the connector 64 and the third passivation layer 60.

As illustrated in FIG. 8A, a top surface 62A of the molding compound 62 near the connector 64 may have a concave shape due to the meniscus effect of the liquid during and after the application and curing processes of the molding compound 62. In some embodiments, the top surface 62A of the molding compound 62 contacts the connector 64 at an angle 66 relative to a plane parallel with a major surface of the substrate 20. In an embodiment, the angle 66 is from about 10 degrees to about 60 degrees.

Figure 8B:
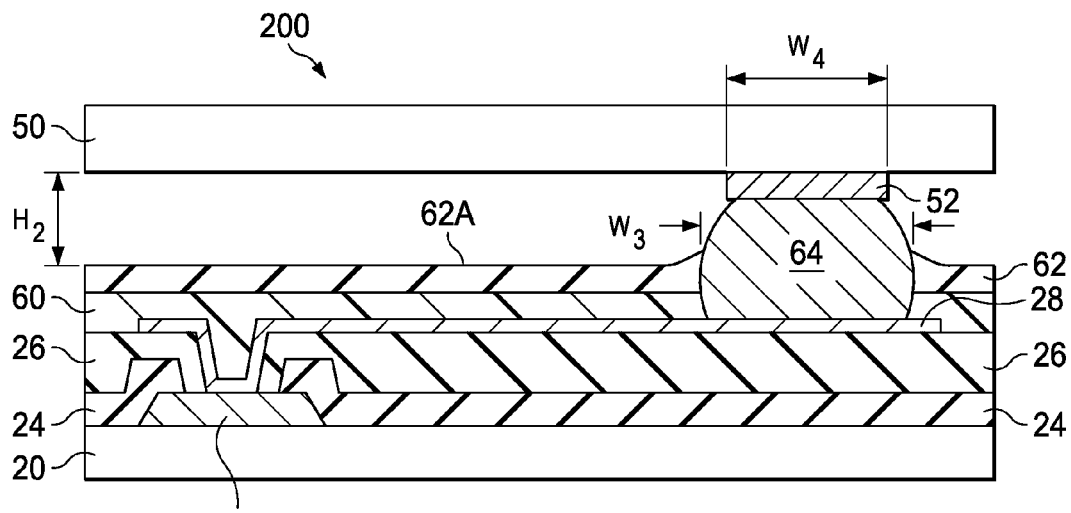

FIG. 8B illustrates the bonding of a second substrate 50 to the connector 64. This bonding process was previously described and the description will not be repeated herein. Second substrate 50 and bond pad 52 have been previously described and the descriptions will not be repeated herein. In an embodiment, the second substrate 50 has a standoff height $H_2$ from the top surface 34A of the molding compound 34 from about 20 µm to about 150 µm. As illustrated in FIG. 8B, the connector 64 has a width $W_3$ at the top surface 62A of the molding compound 62 and the bond pad 52 has a width $W_4$. In an embodiment, the ratio of $W_3$ to $W_4$ may be from about 1:1 to about 1.2:1.

Figure 9A:
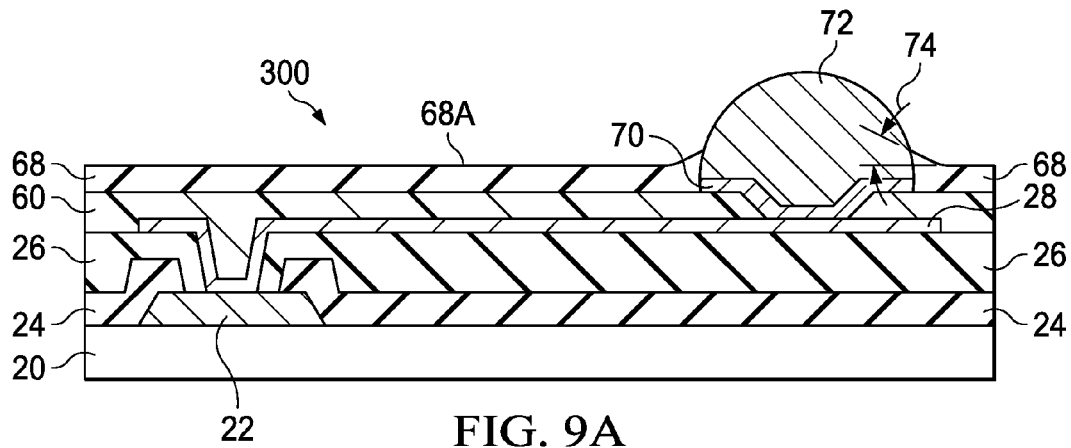
FIGS. 9A and 9B illustrate cross-sectional views of an interconnect structure in accordance with an embodiment.

FIG. 9A illustrates a cross-sectional view of an interconnect structure 300 with a under bump metallization (UBM) 70 between the connector 72 and the PPI 28. Details regarding this embodiment that are similar to those for the previously described embodiment will not be repeated herein.

The substrate 20, the contact pad 22, the first passivation layer 24, the second passivation layer 26, the PPI 28, and the third passivation layer 60 may be similar to those described above and the descriptions will not be repeated herein. The connector 72 may be similar to the connector 32 described above and the description will not be repeated herein, although the connectors 72 and 32 need not be the same. The manufacture of interconnect structure 300 may be similar to interconnect structure 100 in FIG. 1.

After the formation of PPI 28, the third passivation layer 60 may be formed on the second passivation layer 26 and the PPI 28. The third passivation layer 60 was previously described and the description will not be repeated herein.

After the third passivation layer 60 has been formed, a UBM 70 may be formed on the PPI 28. An opening (not shown) may be formed through the third passivation layer 60 to expose at least a portion of the PPI 28 to allow for electrical and physical contact between the UBM 70 and the PPI 28. The opening may be formed using a suitable photolithographic mask and etching process, although any suitable process to expose a portion of the PPI 28 may be used.

After the opening is formed through the third passivation layer 60, the UBM 70 may be formed along the third passivation layer 60 and in the opening over the PPI 28. In an embodiment the UBM 70 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 70. Any suitable materials or layers of material that may be used for the UBM 70 are fully intended to be included within the scope of the current application. In some embodiments, the PPI 28 may be formed as a UBM 28 (not shown) in a similar manner as described above for UBM 70. In these embodiments, the UBM 70 may be formed in contact with the UBM 28.

After the UBM 70 is formed, a connector 72 may be formed on the UBM 70 to electrically couple the connector 72 to the PPI 28. The connector 72 may be similar to the connectors 32 and 64 described above and the description will not be repeated herein.

After the connector 72 has been formed, a molding compound 68 may be formed on the third passivation layer 60 and surrounding the UBM 70 and a lower portion of the connector 72. The molding compound 68 may be similar to the molding compound 34 described above except that it is formed on the third passivation layer 60 rather than the PPI 28 and the second passivation layer 26 and the description of the molding compound will not be repeated. The molding compound may undergo similar processing as molding compound 34 such as pressure molding, curing, and plasma cleaning as described above.

As illustrated in FIG. 9A, a top surface 68A of the molding compound 68 near the connector 72 may have a concave shape due to the meniscus effect of the liquid during and after the application and curing processes of the molding compound 68. In some embodiments, the top surface 68A of the molding compound 68 contacts the connector 72 at an angle 74 relative to a plane parallel with a major surface of the substrate 20. In an embodiment, the angle 74 is from about 10 degrees to about 60 degrees.

Figure 9B:
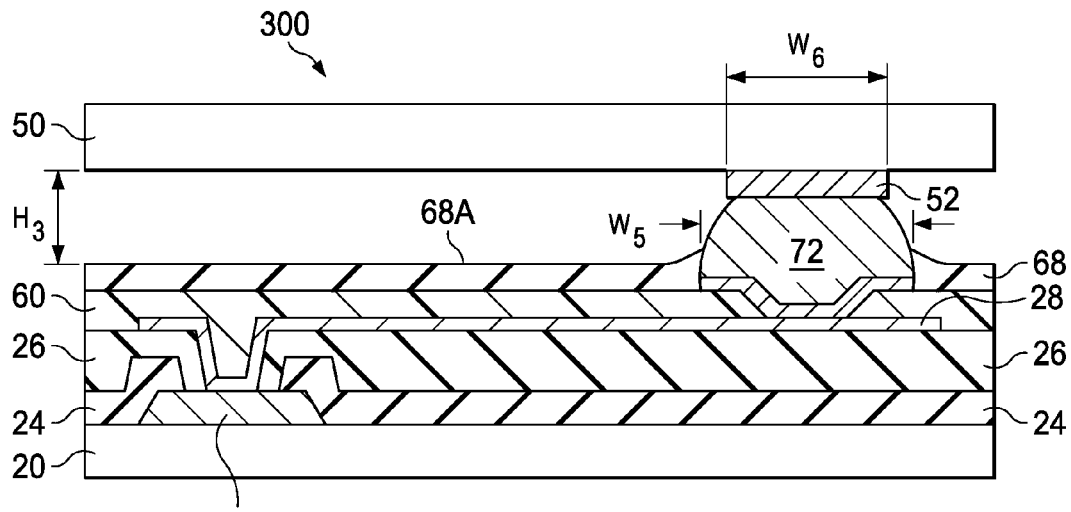
Figure 10:
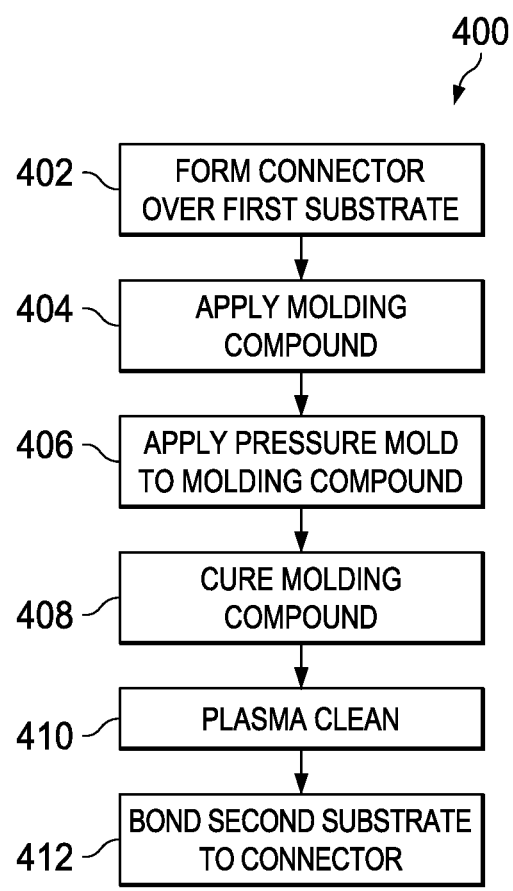
FIG. 10 illustrates a process flow of the process illustrated in FIGS. 1 through 7 in accordance with an embodiment.

FIG. 9B illustrates the bonding of a second subtract 50 to the connector 72. This bonding process was previously described and the description will not be repeated herein. Second substrate 50 and bond pad 52 have been previously described and the descriptions will not be repeated herein. In an embodiment, the second substrate 50 has a standoff height $H_3$ from the top surface 68A of the molding compound 68 from about 20 µm to about 150 µm. As illustrated in FIG. 9B, the connector 72 has a width $W_5$ at the top surface 68A of the molding compound 68 and the bond pad 52 has a width $W_6$. In an embodiment, the ratio of $W_5$ to $W_6$ may be from about 1:1 to about 1.2:1.

It has been found that the molding compound 34 surrounding the connectors 32 and/or the bonding structures 32 protects their shape and reduces the stress between the connectors/bonding structures and the underlying interconnect. Further, the molding compound 34 protects the underlying structures such as the PPI 28, the passivation layers 24 and 26, the contact pad 22, and the substrate 20 from the stresses of later processing steps. This protection afforded by the molding compound 34 results in improved the reliability of the interconnect structure, especially for larger dies and chips.

An embodiment is an interconnect structure including a post-passivation interconnect (PPI) over a first substrate and a conductive connector on the PPI. The interconnect structure further includes a molding compound on a top surface of the PPI and surrounding a portion of the conductive connector, a top surface of the molding compound adjoining the conductive connector at an angle from about 10 degrees to about 60 degrees relative to a plane parallel with a major surface of the first substrate, the conductive connector having a first width at the adjoining top surface of the molding compound, and a second substrate over the conductive connector, the second substrate being mounted to the conductive connector.

Another embodiment is an interconnect structure including a contact pad on a top surface of a first substrate, a first passivation layer on the top surface of the first substrate, the first passivation layer being on a portion of a top surface of the contact pad, a second passivation layer on the first passivation layer, the second passivation layer being on a portion of the top surface of the contact pad, and a post-passivation interconnect (PPI) contacting the top surface of the contact pad and extending along a top surface of the second passivation layer. The interconnect structure further includes a third passivation layer on a top surface of the PPI, a connector on the top surface of the PPI, the third passivation layer adjoining a lower portion of the connector, a molding compound disposed on a top surface of the third passivation layer, the molding compound covering a middle portion of the connector and exposing a portion of the connector, the molding compound having a different material composition than the third passivation layer, and a bond pad on a top surface of a second substrate, the bond pad being bonded to the connector, the bond pad having a second width, the connector having a first width at an adjoining top surface of the molding compound.

A further embodiment is a method of forming an interconnect structure, the method including forming a post-passivation interconnect (PPI) over a first substrate and forming a conductive connector on the PPI. The method further includes forming a molding compound over the PPI and surrounding a portion of the conductive connector, a top surface of the molding compound adjoining the conductive connector at an angle from about 10 degrees to about 60 degrees relative to a plane parallel with a major surface of the first substrate, the conductive connector having a first width at the adjoining top surface of the molding compound, and bonding a second substrate to the conductive connector.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An interconnect structure comprising:
   a post-passivation interconnect (PPI) over a first substrate;
   a conductive connector on the PPI;
   a molding compound on a top surface of the PPI and surrounding a portion of the conductive connector, the molding compound having a concave top surface adjoining and surrounding the conductive connector the conductive connector having a first width at the adjoining, concave top surface of the molding compound, wherein the concave top surface of the molding compound adjoining and surrounding the conductive connector has an angle from about 10 degrees to about 60 degrees relative to a plane parallel with a major surface of the first substrate; and
   a second substrate over the conductive connector, the second substrate being mounted to the conductive connector.

2. The interconnect structure of claim 1 further comprising:
   a contact pad on a top surface of the first substrate;
   a first passivation layer on the top surface of the first substrate, the first passivation layer being on a portion of a top surface of the contact pad; and
   a second passivation layer on the first passivation layer, the second passivation layer being on a portion of the top surface of the contact pad, the PPI being on a top surface of the second passivation layer.

3. The interconnect structure of claim 2, wherein the first passivation layer comprises silicon nitride, silicon oxide, or a combination thereof, and wherein the second passivation layer comprises a polymer, polyimide, or a combination thereof.

4. The interconnect structure of claim 2 further comprising a third passivation layer on the top surface of the PPI and surrounding a lower portion of the conductive connector.

5. The interconnect structure of claim 4, wherein a portion of the molding compound is laterally between the third passivation layer and the lower portion of the conductive connector.

6. The interconnect structure of claim 1 further comprising:
   a bond pad on a top surface of the second substrate, the bond pad being bonded to the conductive connector, the bond pad having a second width.

7. The interconnect structure of claim 6, wherein a ratio of the first width to the second width is from 1:1 to about 1.2:1.

8. The interconnect structure of claim 1, wherein a distance between the top surface of the molding compound and the top surface of the second substrate is from about 20 µm to about 150 µm.

9. The interconnect structure of claim 1, wherein the molding compound comprises an epoxy, a polyimide, polybenzoxazole, or a combination thereof.

10. An interconnect structure comprising:
    a contact pad on a top surface of a first substrate;
    a first passivation layer on the top surface of the first substrate, the first passivation layer directly adjoining a portion of a top surface of the contact pad;
    a second passivation layer on the first passivation layer, the second passivation layer directly adjoining a portion of the top surface of the contact pad;
    a post-passivation interconnect (PPI) contacting the top surface of the contact pad and extending along a top surface of the second passivation layer;
    a third passivation layer on a top surface of the PPI;
    a connector on the top surface of the PPI, the third passivation layer directly adjoining a lower portion of the connector;
    a molding compound disposed on a top surface of the third passivation layer, the molding compound covering a middle portion of the connector and exposing a portion of the connector, the molding compound having a different material composition than the third passivation layer; and
    a bond pad on a top surface of a second substrate, the bond pad being bonded to the connector, the bond pad having a second width, the connector having a first width at an adjoining top surface of the molding compound.

11. The interconnect structure of claim 10, wherein a top surface of the molding compound adjoins the connector at an angle from about 10 degrees to about 60 degrees relative to a plane parallel with a major surface of the first substrate.

12. The interconnect structure of claim 10 further comprising a first under bump metallization (UBM) between the connector and the PPI, the first UBM electrically and physically contacting the connector and the PPI.

13. The interconnect structure of claim 10, wherein a ratio of the first width to the second width is from 1:1 to about 1.2:1.

14. The interconnect structure of claim 10, wherein a distance between the top surface of the molding compound and the top surface of the second substrate is from about 20 µm to about 150 µm.

15. A device comprising:
- a conductive pad on a top surface of a first substrate; a first dielectric layer on the top surface of the first substrate, the first dielectric layer directly adjoining a portion of a top surface of the conductive pad;
- a second dielectric layer over the first dielectric layer, the second dielectric layer directly adjoining a portion of the top surface of the conductive pad;
- a conductive interconnect directly adjoining a top surface of the second dielectric layer and extending through the second dielectric layer to directly adjoin the top surface of the conductive pad;
- a third dielectric layer over the conductive interconnect, the third dielectric layer directly adjoining the top surface of the second dielectric layer;
- an under bump metallization (UBM) extending through the third dielectric layer to directly adjoin the conductive interconnect;
- a conductive connector over and directly adjoining the UBM;
- a molding compound over the third dielectric layer, the UBM, and the conductive connector, a first portion of a top surface of the molding compound being substantially parallel with a top surface of the first substrate, and a second portion of the top surface of the molding compound being slanted at a first angle relative to the first portion of the top surface, the second portion being proximate the conductive connector and the first portion being distal from the conductive connector; and
- a bond pad on a top surface of a second substrate, the bond pad being bonded to the conductive connector.

16. The device of claim 15, wherein the first angle is from about 10 degrees to about 60 degrees.

17. The device of claim 15, wherein the molding compound covers a lower portion of the conductive connector, an upper portion of the conductive connector extending above the top surface of the molding compound.

18. The device of claim 15, wherein the molding compound directly adjoins sidewalls of the UBM.

19. The device of claim 17, wherein a portion of the molding compound is interposed between the third dielectric layer and the lower portion of the conductive connector in a first plane, the first plane being parallel to a major surface of the first substrate.

20. The device of claim 15, wherein the first dielectric layer comprises silicon nitride, silicon oxide, or a combination thereof, wherein the second dielectric layer comprises a polymer, polyimide, or a combination thereof, and wherein the molding compound comprises an epoxy, a polyimide, polybenzoxazole, or a combination thereof.

* * * * *